United States Patent
Chapman et al.

(10) Patent No.: US 8,212,332 B2
(45) Date of Patent: Jul. 3, 2012

(54) BIAS-CONTROLLED DEEP TRENCH SUBSTRATE NOISE ISOLATION INTEGRATED CIRCUIT DEVICE STRUCTURES

(75) Inventors: Phillip Francis Chapman, Essex Junction, VT (US); David Goren, Haifa (IL); Rajendran Krishnasamy, Essex Junction, VT (US); Benny Sheinman, Haifa (IL); Shlomo Shlafman, Haifa (IL); Raminderpal Singh, Hopewell Junction, NY (US); Wayne H. Woods, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/207,480

(22) Filed: Aug. 11, 2011

(65) Prior Publication Data

US 2011/0291238 A1    Dec. 1, 2011

Related U.S. Application Data

(63) Continuation of application No. 12/506,270, filed on Jul. 21, 2009, now Pat. No. 8,021,941.

(51) Int. Cl.
*H01L 27/108* (2006.01)
*H01L 29/76* (2006.01)
*H01L 29/94* (2006.01)
*H01L 31/119* (2006.01)
*H01L 29/00* (2006.01)

(52) U.S. Cl. ......... 257/508; 257/516; 257/301; 257/532
(58) Field of Classification Search ................ 257/296, 257/301–302, 506–510, 528–535, E21.646
See application file for complete search history.

(56) References Cited

U.S. PATENT DOCUMENTS

| | | | |
|---|---|---|---|
| 6,121,148 A | 9/2000 | Bashir et al. | |
| 6,396,121 B1 | 5/2002 | Bertin et al. | |
| 6,498,372 B2 | 12/2002 | Rankin et al. | |
| 6,544,837 B1 | 4/2003 | Divakauni et al. | |
| 7,414,278 B2 * | 8/2008 | Sugatani et al. | 257/296 |
| 7,939,415 B2 * | 5/2011 | Richter | 257/532 |
| 8,053,309 B2 * | 11/2011 | Lee | 257/301 |
| 2007/0145489 A1 | 6/2007 | Yeh et al. | |
| 2008/0073747 A1 | 3/2008 | Chao et al. | |

* cited by examiner

*Primary Examiner* — Cuong Q Nguyen
(74) *Attorney, Agent, or Firm* — Zaretsky Howie Woods Oviatt Gilman LLP

(57) ABSTRACT

A novel and useful apparatus for and method of providing noise isolation between integrated circuit devices on a semiconductor chip. The invention addresses the problem of noise generated by digital switching devices in an integrated circuit chip that may couple through the silicon substrate into sensitive analog circuits (e.g., PLLs, transceivers, ADCs, etc.) causing a significant degradation in performance of the sensitive analog circuits. The invention utilizes a deep trench capacitor (DTCAP) device connected to ground to isolate victim circuits from aggressor noise sources on the same integrated circuit chip. The deep penetration of the capacitor creates a grounded shield deep in the substrate as compared with other prior art shielding techniques.

17 Claims, 11 Drawing Sheets

BIAS-CONTROLLED DEEP TRENCH SUBSTRATE NOISE ISOLATION INTEGRATED CIRCUIT DEVICE STRUCTURES

REFERENCE TO PRIORITY APPLICATION

This application is a continuation of U.S. patent application Ser. No. 12/506,270, filed on Jul. 21, 2009 now U.S. Pat. No. 8,021,941, the contents of which are incorporated herein by reference in their entirety.

FIELD OF THE INVENTION

The present invention relates to the field of semiconductor manufacturing, and more particularly relates to bias-controlled deep trench substrate noise isolation integrated circuit device structures.

SUMMARY OF THE INVENTION

The present invention is a novel and useful apparatus for and method of providing noise isolation between integrated circuit devices on a semiconductor chip. The invention addresses the problem of noise generated by digital switching devices in an integrated circuit chip that may couple through the silicon substrate into sensitive analog circuits (e.g., PLLs, transceivers, ADCs, etc.) causing a significant degradation in performance of the sensitive analog circuits. The invention utilizes a deep trench capacitor (DTCAP) device connected to ground to isolate victim circuits from aggressor noise sources on the same integrated circuit chip. The deep penetration of the capacitor creates a grounded shield deep in the substrate as compared with other prior art shielding techniques.

There is thus provided in accordance with the present invention, an integrated circuit device, comprising a semiconductor substrate having a first portion in which aggressor devices are formed and a second portion in which victim devices are formed, a deep trench capacitor having a first node and a second node, said deep trench capacitor formed between said first portion and said second portion, and wherein said first node of said deep trench capacitor is electrically connected to a ground node.

There is also provided in accordance with the present invention, a design structure embodied in a machine readable medium for designing, manufacturing, or testing an integrated circuit, the design structure comprising a semiconductor substrate having a first portion in which aggressor devices are formed and a second portion in which victim devices are formed, a deep trench capacitor formed between said first portion and said second portion, and wherein said deep trench capacitor is electrically connected to a ground node.

There is further provided in accordance with the present invention, an integrated circuit device, comprising a semiconductor substrate having a first portion in which one or more aggressor devices are formed, a well portion formed in said semiconductor substrate, and said well comprising one or more victim devices and a deep trench capacitor operative to electrically couple said well portion to a ground node.

There is also provided in accordance with the present invention, a method of noise isolation for use in an integrated circuit device, the method comprising the steps of providing a semiconductor substrate having a first portion in which aggressor devices are formed and a second portion in which victim devices are formed, forming a deep trench capacitor between said first portion and said second portion, and electrically connecting said deep trench capacitor to a ground node.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
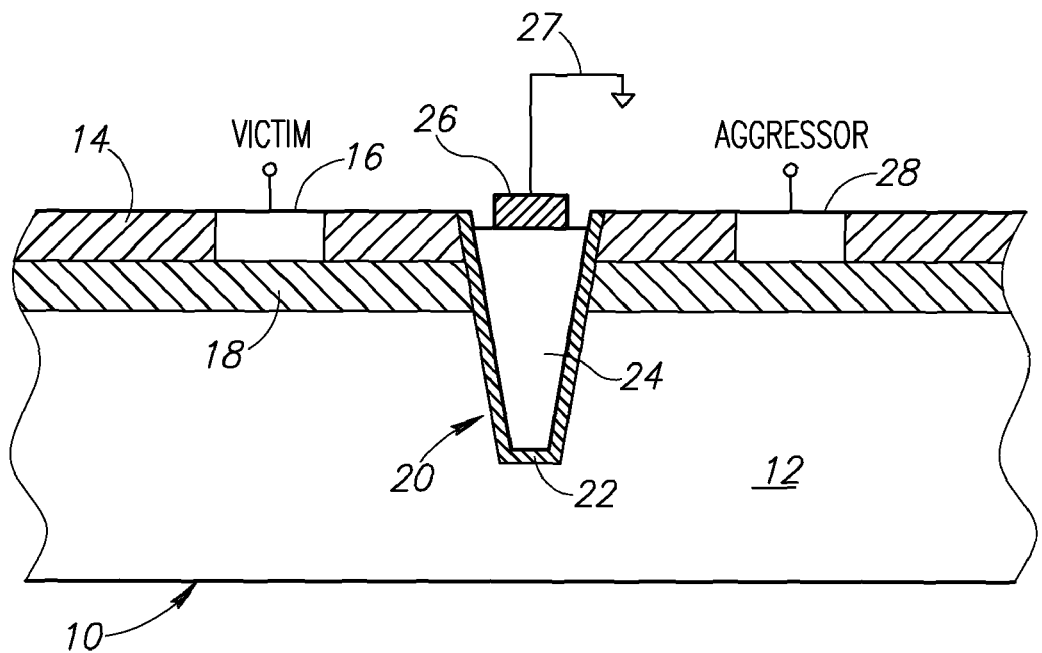
FIG. 1 is a diagram illustrating an example a first embodiment deep trench capacitor noise isolation integrated device structure of the present invention.

The following notation is used throughout this document:

| Term | Definition |
|------|------------|
| ADC | Analog to Digital Converter |
| ASIC | Application Specific Integrated Circuit |
| BOX | Bulk Oxide |
| CMOS | Complementary Metal Oxide Semiconductor |
| DC | Direct Current |
| DTCAP | Deep Trench Capacitor |
| HDL | Hardware Description Language |
| IC | Integrated Circuit |
| IO | Input/Output |

-continued

| Term | Definition |
|---|---|
| IP | Intellectual Property |
| PLL | Phase Locked Loop |
| SOI | Silicon On Insulator |
| STI | Shallow Trench Isolation |
| VHDL | Very High Density Lithography |

DETAILED DESCRIPTION OF THE INVENTION

The present invention is an apparatus for and method of providing noise isolation between integrated circuit devices on a semiconductor chip. The invention addresses the problem of noise generated by digital switching devices in an integrated circuit chip. The noise may couple through the silicon substrate into sensitive analog circuits (e.g., PLLs, transceivers, ADCs, etc.) causing a significant degradation in performance of the sensitive analog circuits.

For example, in processor based integrated circuit chips, the processor circuit portion is the dominant noise source compared to neighboring analog circuits such as ADCs, due to the high switching activity of the digital logic devices of the processor. The effective noise generating area of the processor can be expressed as a function of the active area and activity factor of the switching devices, as shown below in Equation 1.

$$A_{effective} = C \times F \times A_{total} \qquad (1)$$

where $A_{effective}$ is the effective noise-generating area of the processor;

$A_{total}$ is the total processor area;

C is the percentage of the active (i.e. transistor) area of the processor;

F is the activity factor (i.e. percentage of devices switching in phase);

The invention utilizes a deep trench capacitor (DTCAP) device connected to ground to isolate victim circuits from aggressor noise sources on the same integrated circuit chip. Note that the aggressor and victim circuit may comprise analog, digital, or any combination of analog and digital circuits.

Note that references to ground include both AC and DC ground, where AC ground is a ground for any frequency above DC. In addition, depending on the implementation, a connection to ground may include a connection to a power supply such as $V_{DD}$.

In operation, the deep trench capacitor is placed between the aggressor and victim circuit portions of the integrated circuit. The deep trench capacitor is available in most semiconductor technologies and requires relatively very little chip real estate area and penetrates deep into the substrate (e.g., 4-6 μm). The deep penetration of the capacitor creates a grounded shield deep in the substrate as compared with other prior art shielding techniques.

The improved isolation of the deep trench capacitor extends to relatively high frequencies and is not limited to the lower frequency range (as is the case with prior art floating deep trench isolation). In application, the deep trench capacitor isolation mechanism of the present invention can be used in conjunction with additional isolation techniques to increase the overall isolation.

A diagram illustrating an example a first embodiment deep trench capacitor noise isolation integrated device structure of the present invention is shown in FIG. 1. The device, generally referenced 10, comprises silicon substrate 12, buried oxide (BOX) 18, shallow trench isolation (STI) 14, victim circuit devices 16, aggressor circuit devices 28 and deep trench capacitor 20. The deep trench capacitor 20 comprises poly-silicon 24, silicon dioxide layer 22 and CA metal contact 26.

In accordance with the invention, the deep trench capacitor is electrically connected to ground node via connection 27. The contact 26 provides a good electrical connection between the deep trench capacitor and the ground node. Note that the thickness of the silicon dioxide 22 is not critical and is typically on the order of a few nanometers. It is desirable, however, to have as thin an oxide layer as possible to increase the effective capacitance coupling of the deep trench at low frequencies.

Note that the example deep trench capacitor isolation mechanism presented herein is for silicon on insulator (SOI) technology which has inherent substrate noise isolation compared to bulk technology. It is appreciated that one skilled in the semiconductor arts can apply the principles of the present invention to implementations in standard CMOS bulk technologies.

The aggressor circuit may comprise a processor or noisy input/output (IO) core. When activated, the switching operations of the circuit components generate signals which couple through the capacitive coupling of the buried oxide (or through the diffusion capacitance in a bulk technology) into the substrate. Without the benefit of the present invention, the silicon substrate would couple the noise laterally to the area beneath the victim circuit, which may comprise, for example, a sensitive analog decision circuit such as an ADC. The noise would further be coupled through the buried oxide to the victim circuit (e.g., sensitive device) and interfere with its operation.

In accordance with the present invention, one or more deep trench capacitors are used to shield the victim circuit from substrate noise. The deep trench capacitors are connected through a low impedance 27 to ground and are operative to pull in the electric field lines from the aggressor circuit thereby "shading" the victim circuit from the substrate noise generated by the aggressor circuit devices.

Figure 2:
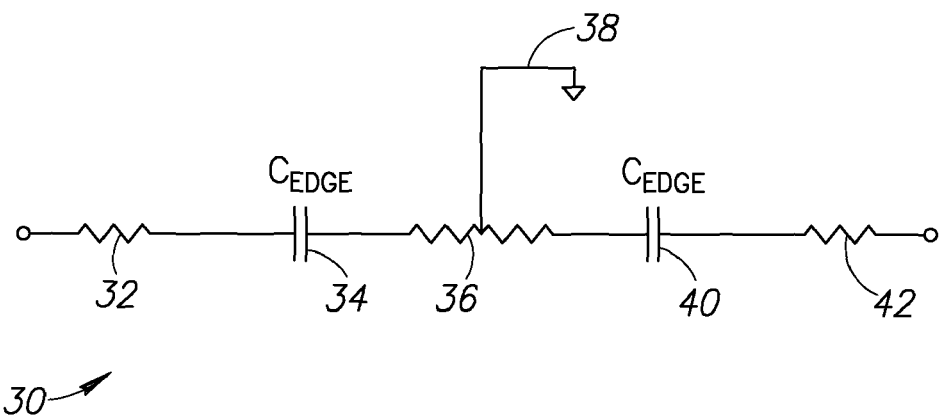
FIG. 2 is a schematic diagram illustrating the equivalent circuit of the integrated device structure of FIG. 1.

A schematic diagram illustrating the simplified equivalent circuit of the integrated device structure of FIG. 1 is shown in FIG. 2. The circuit, generally referenced 30, comprises resistors 32, 36, 42 and capacitors 34, 40. The capacitors and resistors represent the substrate losses, the deep trench capacitor edge capacitance and the series polysilicon resistance. The impedance 36 is connected to ground which provides the relatively high shielding and noise isolation to the victim circuit.

Significant isolation is achieved even with a relatively small separation between the aggressor and victim circuits. For example, with 100 μm between aggressor and victim circuits, a coupling as low as −57 dB at a frequency of 2 GHz can be achieved.

Diagrams illustrating example steps for fabricating the deep trench capacitor of the present invention are shown in FIGS. 3A, 3B, 3C, 3D. A flow diagram illustrating the method of fabricating the deep trench capacitor of the present invention is shown in FIG. 4.

Figure 3A:
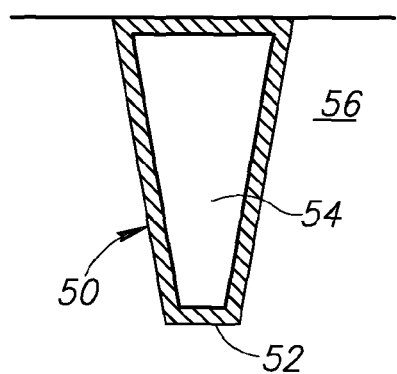
FIGS. 3A, 3B, 3C, 3D are diagrams illustrating example steps for fabricating the deep trench capacitor of the present invention.
Figure 4:
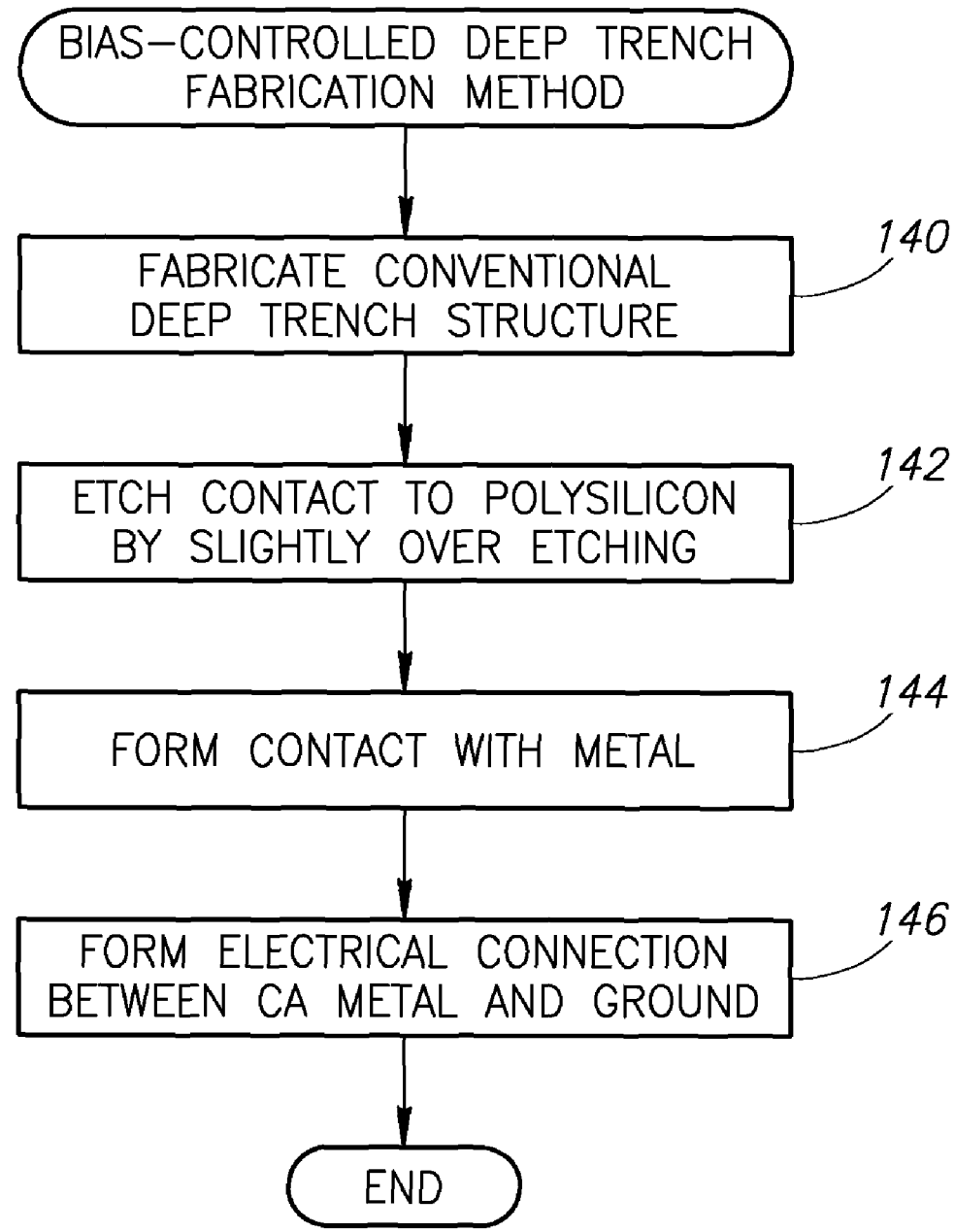
FIG. 4 is a flow diagram illustrating the method of fabricating the deep trench capacitor of the present invention.

FIG. 3A illustrates a device, generally referenced 50, comprising substrate 56, polysilicon 54 and silicon dioxide 52. The device 50 represents the starting point of the process, the fabrication of a conventional deep trench structure (step 140).

Figure 3B:
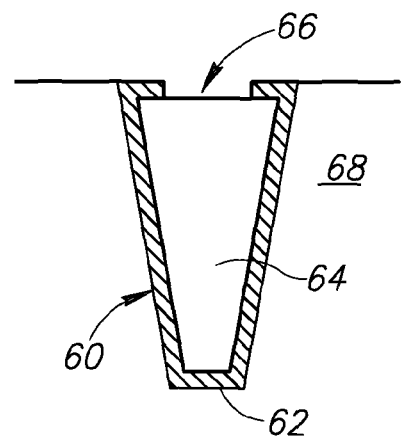

FIG. 3B illustrates a device, generally referenced 60, comprising substrate 68, polysilicon 64 and silicon dioxide 62. After fabrication of a conventional deep trench structure, a contact is etched to the polysilicon by slightly over etching oxide when metal or polysilicon contacts are made to RX (step 142). Metal filled vias are used for connecting transistor drain, source and PC layer to the M1 metal layer. The RX layer denotes the active area of various devices which is where the substrate doping is modified to form transistor drain and source regions, for example.

Figure 3C:
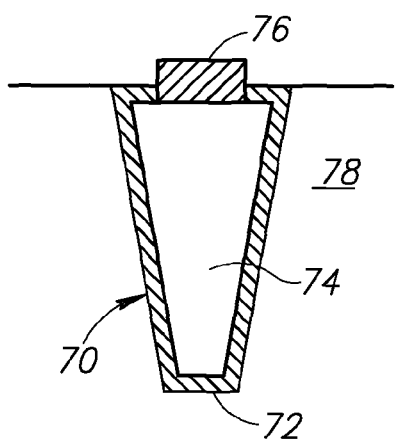

FIG. 3C illustrates a device, generally referenced 70, comprising substrate 78, polysilicon 74 and silicon dioxide 72. In this step, the contact is fabricated with a silicon substrate (e.g., metal contact) in the area etched out in the previous step 142 (step 144).

Figure 3D:
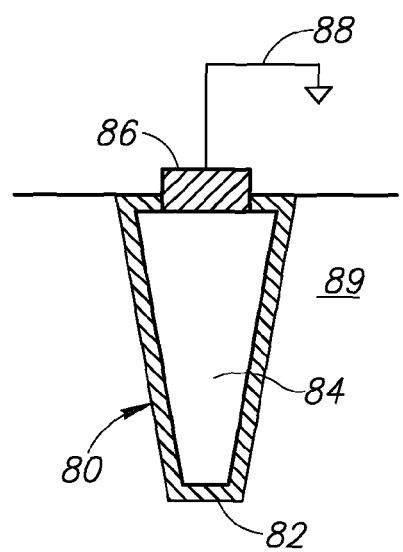

FIG. 3D illustrates a device, generally referenced 80, comprising substrate 89, polysilicon 84, silicon dioxide 82 and contact 86. To achieve noise isolation, after the deep trench capacitor is fabricated with the contact, it is electrically connected to a ground node (step 146). The ground connection 88 provides the electrical shielding to prevent noise coupling from an aggressor circuit to a victim circuit located on the same substrate.

Note that there may be variations in the construction of the deep trench capacitor. It is appreciated that the technique illustrated in FIG. 3 is one example of constructing the DTCAP and that numerous other alternative well-known techniques may be used as well without departing from the scope of the invention. For example, the DTCAP may be constructed using a different polysilicon layer, silicon substrate contact, metal contact, etc.

Figure 5:
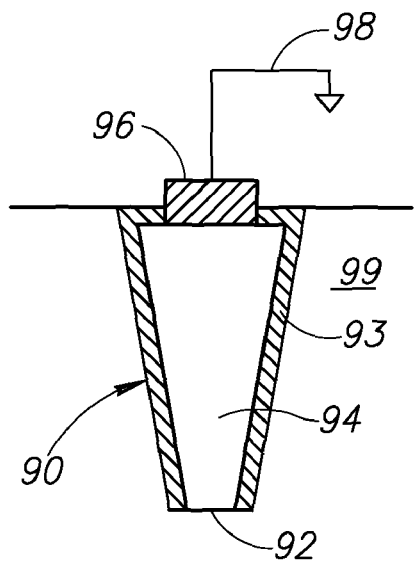
FIG. 5 is a diagram illustrating an example second embodiment deep trench capacitor noise isolation integrated device structure of the present invention.

A diagram illustrating an second embodiment deep trench capacitor noise isolation integrated device structure of the present invention is shown in FIG. 5. The device, generally referenced 90, comprises substrate 99, polysilicon 94, silicon dioxide 93, contact 96, connection to ground 98 and halo implant 92. Halo implants, well known in the art, are doped regions formed by bombarding the semiconductor wafer with tilted beams of ions, often used during the manufacture of semiconductor transistor devices. The halo implants are formed by an anisotropic oxide etch which enables the halo implant at the bottom of the deep trench to contact the polysilicon fill 94 forming an ohmic contact between the polysilicon of the deep trench capacitor and the silicon substrate.

Figure 6:
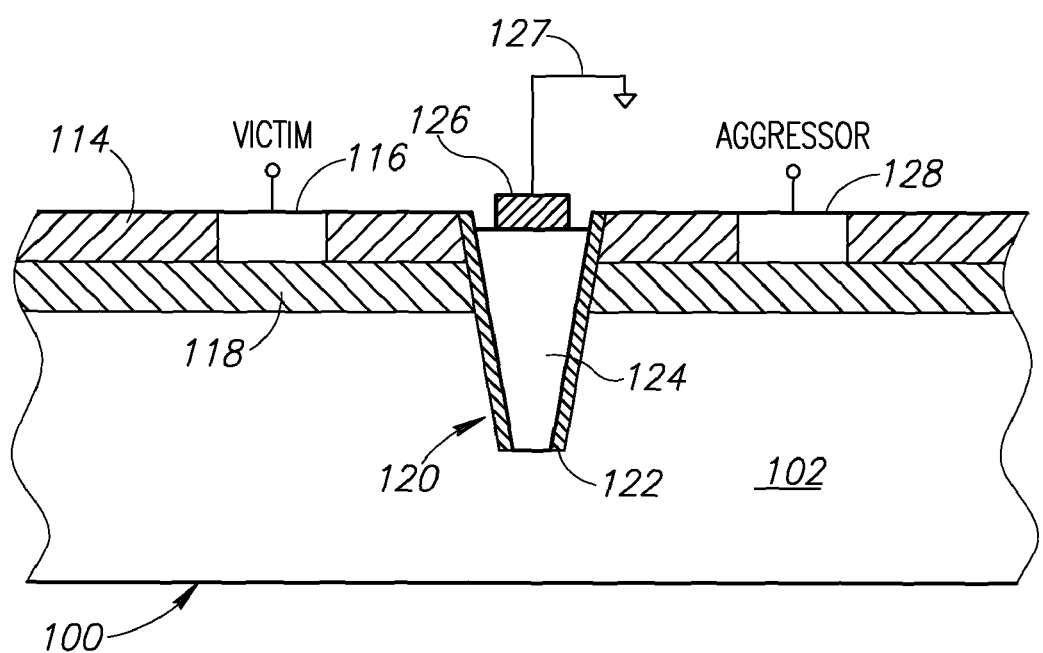
FIG. 6 is a diagram illustrating a second example of the second embodiment deep trench capacitor noise isolation integrated device structure of the present invention.

A diagram illustrating an example of the second embodiment deep trench capacitor noise isolation integrated device structure of the present invention is shown in FIG. 6. The device, generally referenced 100, comprises silicon substrate 102, buried oxide (BOX) 118, shallow trench isolation (STI) 114, victim circuit devices 116, aggressor circuit devices 128 and deep trench capacitor 120. The deep trench capacitor 120 comprises poly-silicon 124, silicon dioxide layer 122 and CA metal contact 126. In accordance with the invention, the deep trench capacitor is electrically connected to ground node via connection 127. The contact 126 provides a good electrical connection between the deep trench capacitor and the ground node.

In this second embodiment, there is no bottom layer of oxide under the deep trench 120. This results in better isolation over a broad frequency range. The improvement in isolation is due to the non dielectric bottom contact which results in a good connection even for very low frequencies (in principle down to DC).

Note that the second embodiment is essentially an extension of the deep trench device to a device which contacts the substrate at the bottom directly. This device is fabricated by (1) anisotropic oxide etch to clear the oxide at the bottom of the capacitor, (2) halo implant through the capacitor to dope the silicon below the capacitor; (3) fill of capacitor with poly; and (4) metal contact at the top of the capacitor poly. The halo implant helps create a good contact between the poly (that fills the capacitor) and the now dopped silicon below the capacitor.

Figure 7:
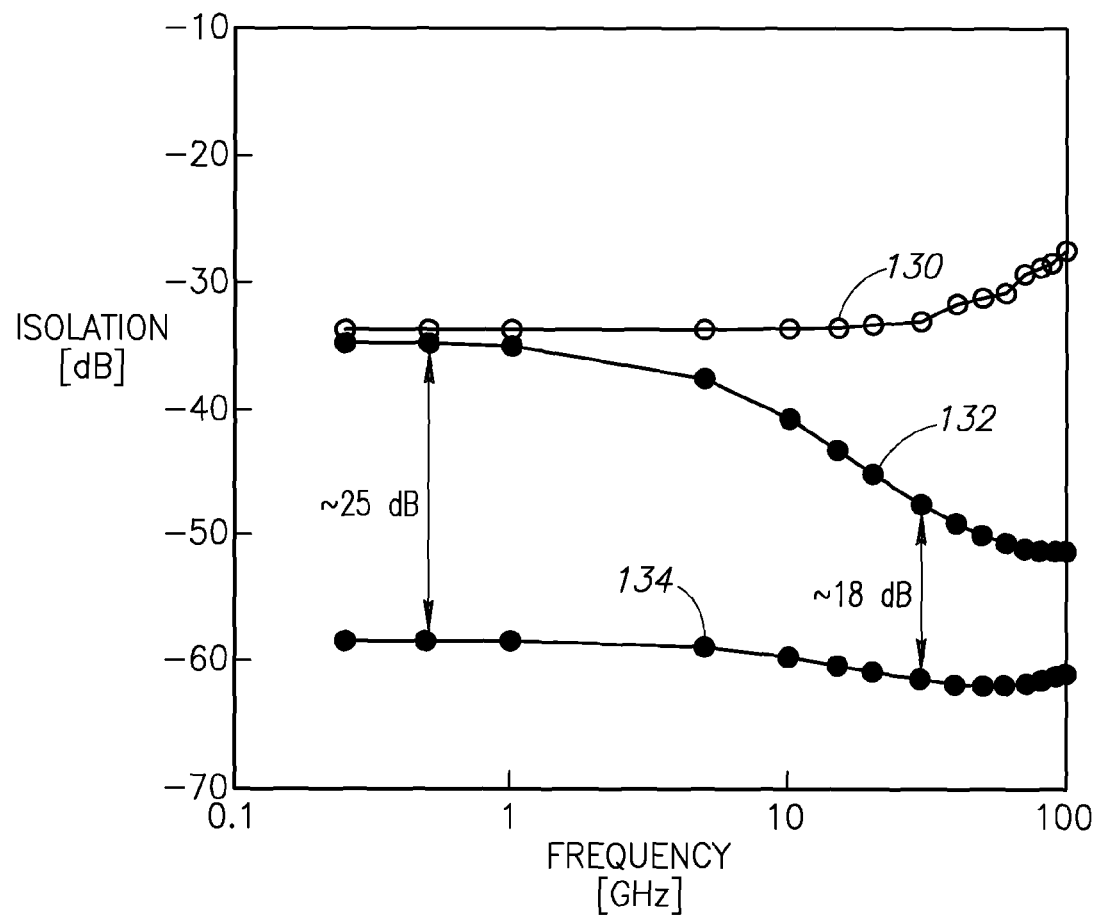
FIG. 7 is a first diagram comparing the degree of isolation versus frequency for the deep trench capacitor of the present invention.

A first diagram comparing the degree of isolation versus frequency for the deep trench capacitor of the present invention is shown in FIG. 7. The results correspond to a 10 micron spacing between the aggressor and the deep trench capacitor which itself is 6 microns deep, 1 micron wide with 0.5 micron poly silicon. Trace 132 shows the isolation achieved by the first embodiment biased deep trench capacitor mechanism 10 (FIG. 1). Trace 134 shows the isolation achieved by the second embodiment grounded deep trench capacitor mechanism 100 (FIG. 6). Trace 130 shows the isolation achieved using unbiased (i.e. floating) deep trench devices. Note the almost 25 dB improvement in isolation of the second embodiment device over the first embodiment device. Note also the significant improvement in isolation for the first embodiment device at frequencies over 7-8 GHz.

Figure 8:
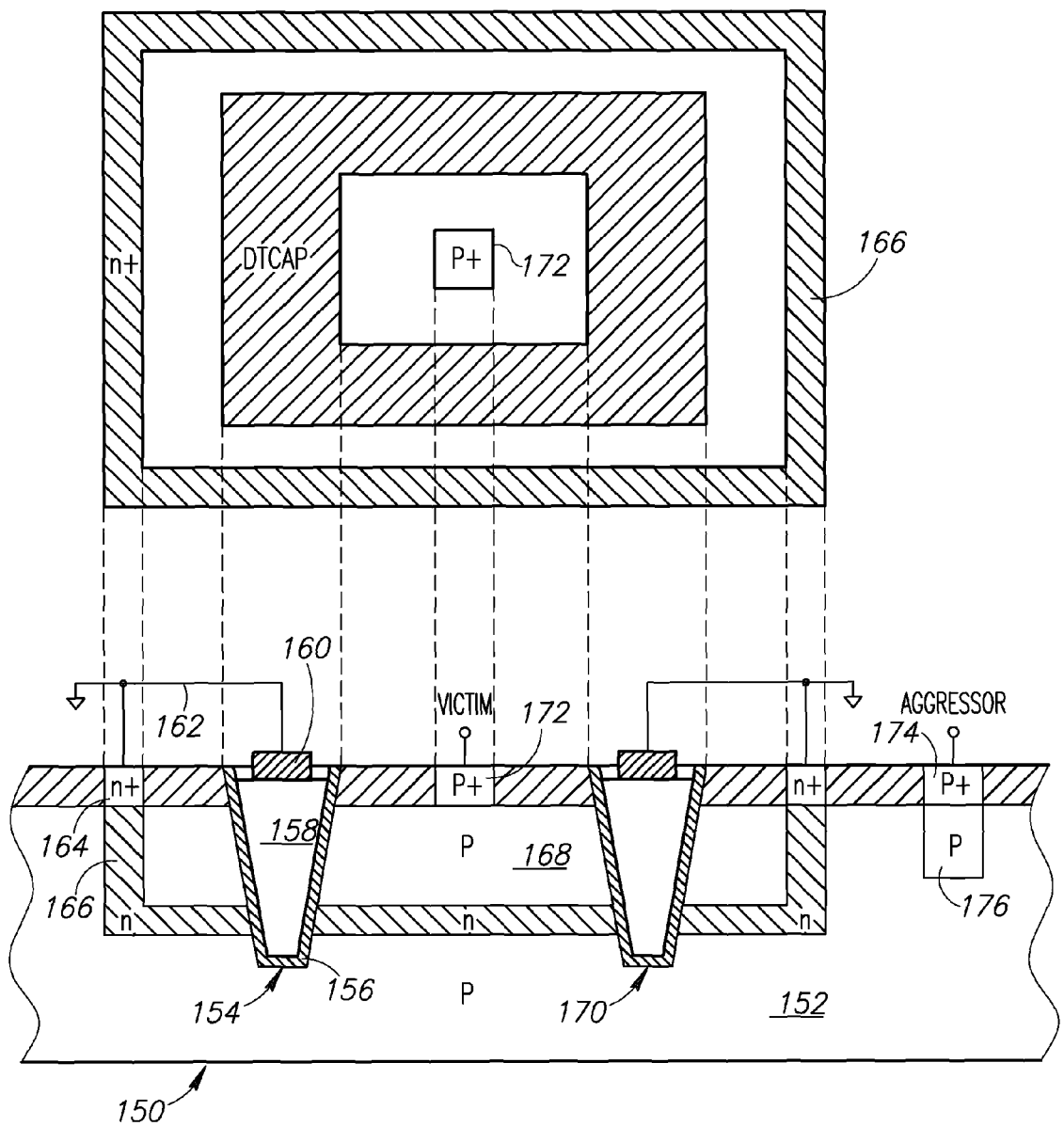
FIG. 8 is a diagram illustrating an example third embodiment deep trench capacitor noise isolation integrated device structure of the present invention fabricated in a triple well.

A diagram illustrating an example third embodiment deep trench capacitor noise isolation integrated device structure of the present invention fabricated in a triple well is shown in FIG. 8. The device, generally referenced 150, comprises p-type substrate 152, n-well 166, n+ regions 164, p-well 168, victim circuit and p+ region 172, aggressor circuit and p+ region 174, p-well 176, deep trench capacitors 154, polysilicon 158, silicon dioxide 156, contacts 160 and ground connections 162.

The deep trench capacitor isolation mechanism of FIGS. 1 and 6 can be extended in bulk technologies to a triple well isolation mechanism with functions to further reduce noise coupling between aggressor and victim circuits. The addition of the n-doped bottom layer 166 enables the victim circuit to be surrounded with a grounded ring from all directions which further increases the noise isolation by approximately an additional 10 dB at high frequencies compared to conventional triple well isolation. Note that the victim circuit may not necessarily be surrounded by the ground ring, as other configurations are also contemplated by the invention. In addition, the deep trench capacitor does not necessarily completely enclose the victim circuit, as other configurations are also contemplated by the invention. For example different ground ring and deep trench capacitor configurations may be used depending on the particular circuit configuration implementation. In alternative embodiments, the triple well may be replaced with a single or double well.

Figure 9:
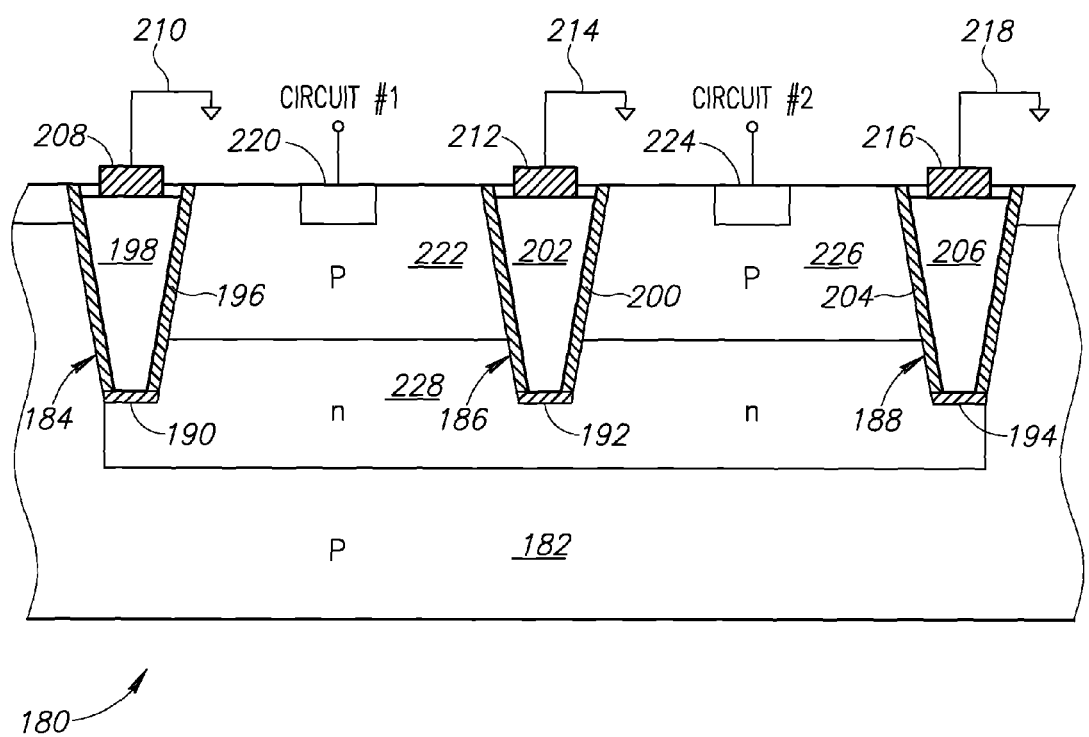
FIG. 9 is a diagram illustrating an example a fourth embodiment deep trench capacitor noise isolation integrated device structure of the present invention fabricated in a triple well.

A diagram illustrating an example a fourth embodiment deep trench capacitor noise isolation integrated device structure of the present invention fabricated in a triple well is shown in FIG. 9. The device, generally referenced 180, comprises p-type substrate 182, n-well 228, p-wells 222, 226, circuit #1 220, circuit #2 224, deep trench capacitors 184, 186, 188, polysilicon 198, 202, 206, silicon dioxide 196, 200, 204, deep n-well contact points 190, 192, 194, contacts 208, 212, 216 and ground connections 210, 214, 218.

In triple well devices, this fourth embodiment of the deep trench capacitor isolation mechanism can be used to make high density electrical contacts to a deep well rather than only contacts at the edges (i.e. perimeter) of the deep well since contacts will not effect p-wells or adjacent circuitry. The device 180 may eliminate the use of implanted "plugs" for contacting deep wells. In addition, the device 180 functions to anchor the deep well to a large capacitance. Note that circuits #1 and #2 represents any two circuits (i.e. digital or analog) that need isolation between them, i.e. aggressor and victim circuits, or two noisy circuits where noise from each circuit couples into the other circuit.

Figure 10:
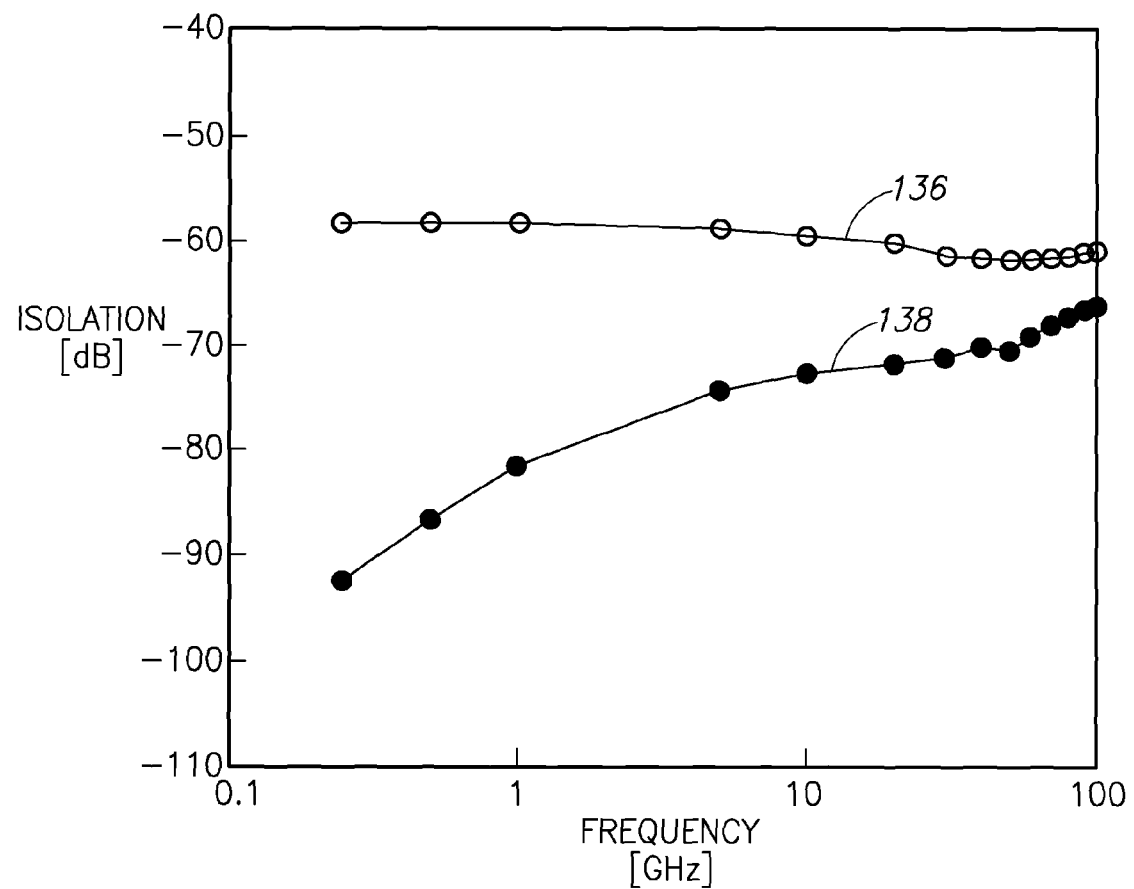
FIG. 10 is a second diagram comparing the degree of isolation versus frequency for the deep trench capacitor of the present invention.

A second diagram comparing the degree of isolation versus frequency for the deep trench capacitor of the present invention is shown in FIG. 10. The results correspond to a 10 micron spacing between the aggressor and the deep trench capacitor which itself is 6 microns deep, 1 micron wide with 0.5 micron poly silicon. Trace 136 shows the isolation achieved by the first embodiment biased deep trench capacitor mechanism 10 (FIG. 1). Trace 138 shows the isolation achieved by the third embodiment (triple well) biased deep trench capacitor mechanism 150 (FIG. 8). Note the improvement by over 30 dB in isolation of the triple well (third embodiment) device over the first embodiment device at low frequencies (e.g., less than 1 GHz). This improvement diminishes, however, as the frequency increases.

Figure 11:
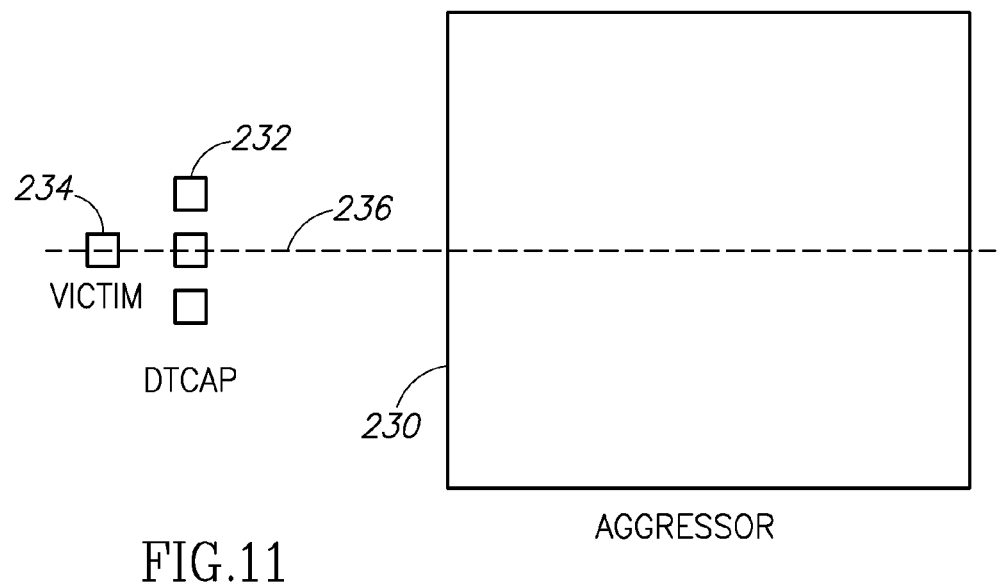
FIG. 11 is a diagram illustrating a top down view of an example circuit.

A diagram illustrating a top down view of an example circuit is shown in FIG. 11. The example circuit comprises an aggressor circuit area 230, deep trench capacitor structures of the present invention 232 and victim circuit area 234. This is an example where the aggressor circuit is orders of magnitude larger than the victim circuit.

Figure 12:
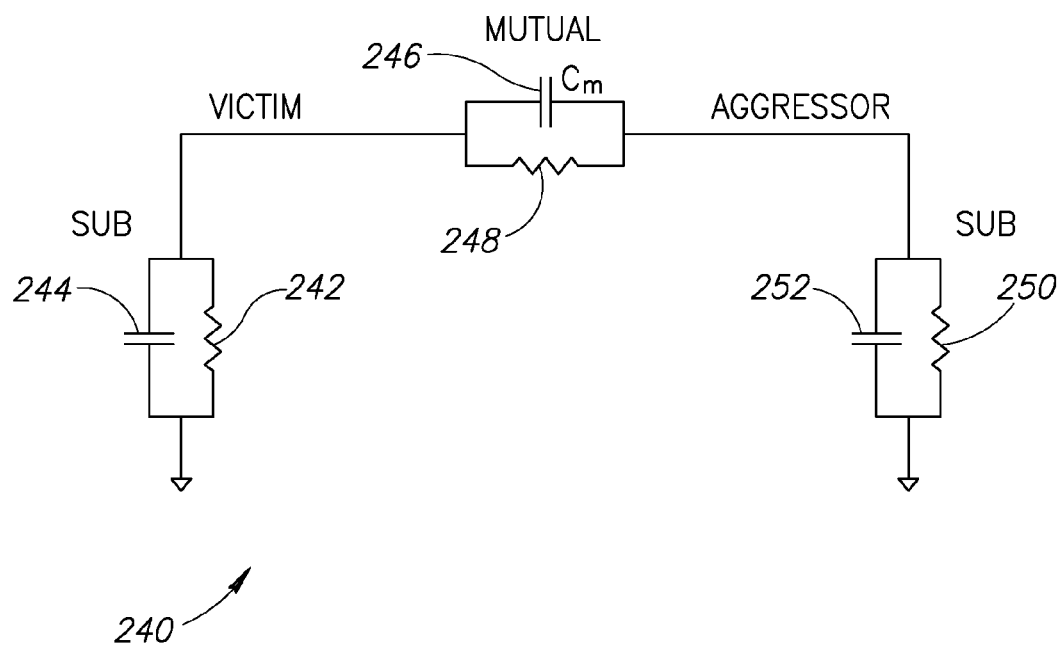
FIG. 12 is a schematic diagram illustrating the equivalent circuit of the integrated device structure of FIG. 11 along the dotted horizontal line.

A schematic diagram illustrating the equivalent circuit of the integrated device structure of FIG. 11 along the dotted horizontal line 236 is shown in FIG. 12. The equivalent circuit, generally referenced 240, comprises a victim portion including parallel resistor 242 and capacitor 244 coupled to ground, an aggressor portion including parallel resistor 250 and capacitor 252 coupled to ground, and a mutual capacitance portion including parallel capacitor 246 and resistor 248.

Figure 13:
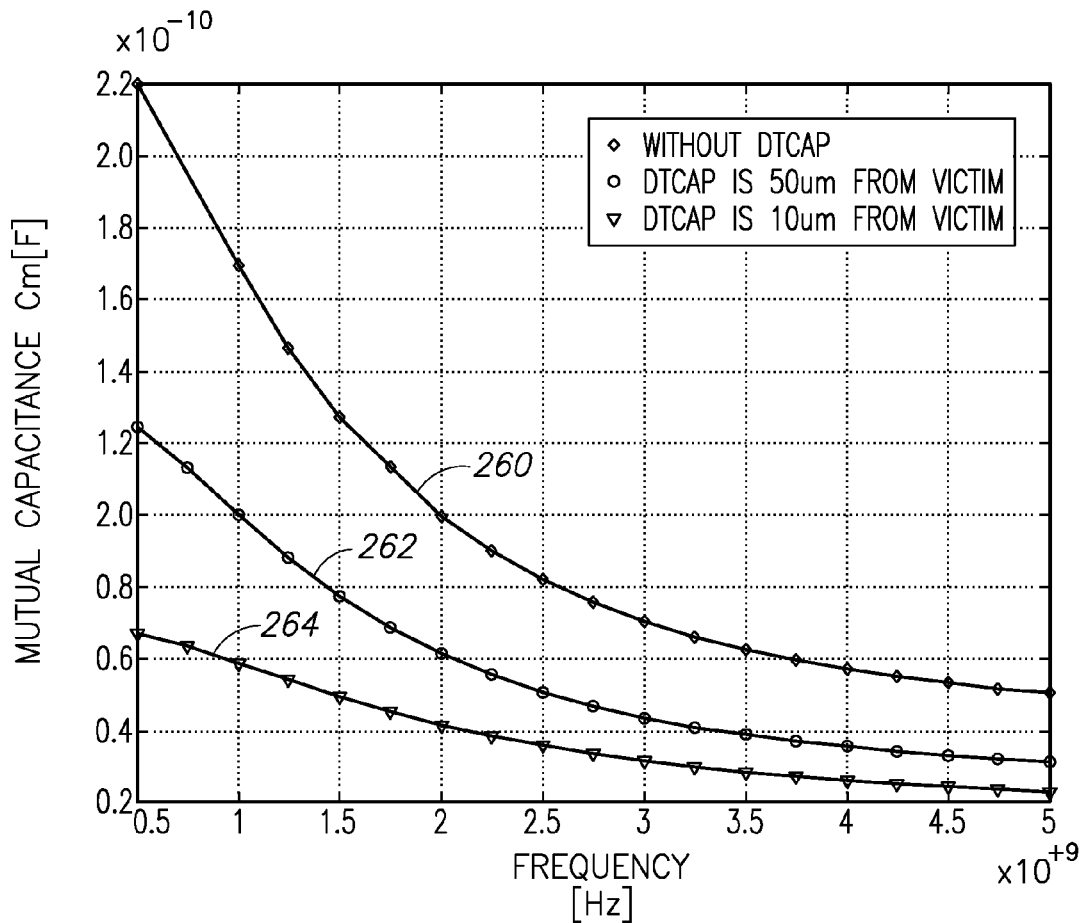
FIG. 13 is a diagram illustrating the behavior of the coupling capacitance value.

A diagram illustrating the behavior of the coupling capacitance value of the scenario shown in FIG. 11 is shown in FIG. 13. Trace 260 shows the mutual capacitance without the deep trench capacitor structure of the present invention. Trace 262 shows the mutual capacitance with the deep trench capacitor structure of the present invention located 50 μm from the victim circuit area. Trace 264 shows the mutual capacitance with the deep trench capacitor structure of the present invention located 10 μm from the victim circuit area. Note the significant drop in mutual capacitance (i.e. less noise coupling) with the deep trench capacitor at 10 μm especially at lower frequencies.

Several advantages of the deep trench capacitor isolation mechanism of the present invention include (1) the placement of substrate noise isolation ground contacts anywhere including within dense circuit designs without creating DC current paths or shorts between n and p wells; (2) relatively small additional complexity and cost to fabricate; (3) provides a grounded substrate contact placement under or to wells in a triple well process; (4) provides victim circuits relatively high noise isolation levels against neighboring aggressor circuits; (5) large sidewall capacitance maximizes the effective frequency operation range; and (6) triple and non-triple well deep trench device structures provide inherently large capacitance in guard rings that aid in providing 'true' ground potential at higher operating frequencies.

Figure 14:
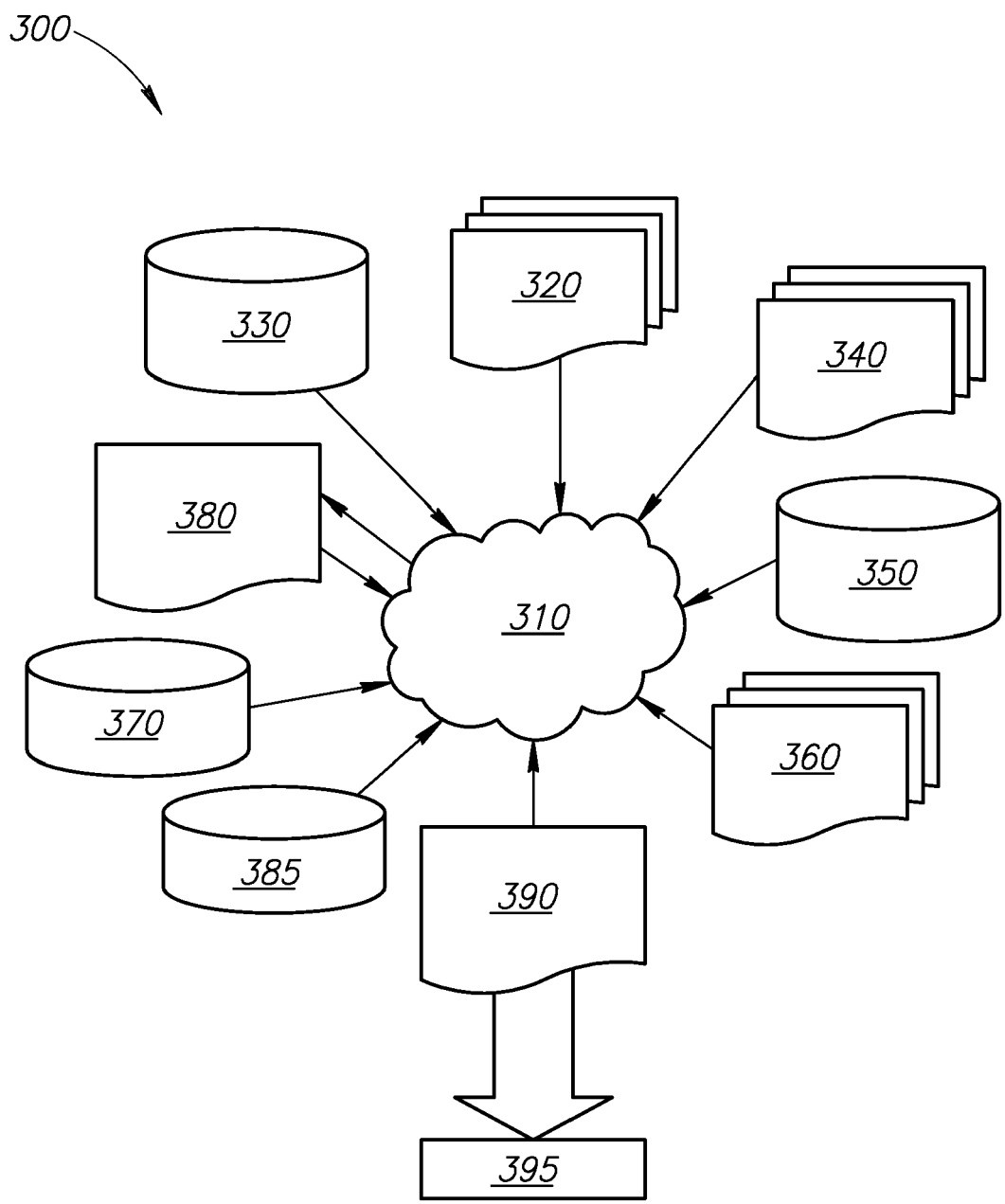
FIG. 14 is a block diagram of an exemplary design flow of a design process used in semiconductor design, manufacturing, and/or testing of the deep trench capacitor of the present invention.

A block diagram of an exemplary design flow of a design process used in semiconductor design, manufacturing, and/or testing of the deep trench capacitor of the present invention is shown in FIG. 14. The design flow, generally referenced 300, may vary depending on the type of IC being designed. For example, a design flow for building an application specific IC (ASIC) may differ from a design flow for designing a standard component. Design structure 320 is preferably an input to a design process 310 and may come from an IP provider, a core developer, or other design company or may be generated by the operator of the design flow, or from other sources. Design structure 320 comprises an embodiment of the invention as shown in FIGS. 1, 3A, 3B, 3C, 3D, 5, 6, 8 and/or 9 in the form of schematics or HDL, a hardware-description language (e.g., Verilog, VHDL, C, etc.). Design structure 320 may be contained on one or more machine readable medium. For example, design structure 320 may be a text file or a graphical representation of an embodiment of the invention as shown in FIGS. 1, 3A, 3B, 3C, 3D, 5, 6, 8 and/or 9. Design process 310 preferably synthesizes (or translates) an embodiment of the invention as shown in FIGS. 1, 3A, 3B, 3C, 3D, 5, 6, 8 and/or 9 into a netlist 380, where netlist 380 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is re-synthesized one or more times depending on design specifications and parameters for the circuit.

Design process 310 may include using a variety of inputs; for example, inputs from library elements 330 which may house a set of commonly used elements, circuits, and devices, including models, layouts, and symbolic representations, for a given manufacturing technology (e.g., different technology nodes, 32 nm, 45 nm, 90 nm, etc.), design specifications 340, characterization data 350, verification data 360, design rules 370, and test data files 385 (which may include test patterns and other testing information).

Design process 310 may further include, for example, standard circuit design processes such as timing analysis, verification, design rule checking, place and route operations, etc. One of ordinary skill in the art of integrated circuit design can appreciate the extent of possible electronic design automation tools and applications used in design process 310 without deviating from the scope and spirit of the invention. The design structure of the invention is not limited to any specific design flow.

Design process 310 preferably translates an embodiment of the invention as shown in FIGS. 1, 3A, 3B, 3C, 3D, 5, 6, 8 and/or 9, along with any additional integrated circuit design or data (if applicable), into a second design structure 390. Design structure 390 resides on a storage medium in a data format used for the exchange of layout data of integrated circuits (e.g. information stored in a GDSII (GDS2), GL1, OASIS, or any other suitable format for storing such design structures). Design structure 390 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 3A, 3B, 3C, 3D, 5, 6, 8 and/or 9. Design structure 390 may then proceed to a stage 395 where, for example, design structure 390: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An integrated circuit device, comprising:
   a semiconductor substrate having a first portion in which one or more aggressor devices are formed and a second portion in which one or more victim devices are formed;
   a deep trench capacitor having a first node and a second node, said deep trench capacitor formed between said first portion and said second portion; and
   wherein said first node of said deep trench capacitor is electrically connected to a ground node, said deep trench capacitor operative to provide noise isolation between said first portion and said second portion of said integrated circuit.

2. The integrated circuit device according to claim 1, wherein said first and second portions comprise one or more digital or analog circuits.

3. The integrated circuit device according to claim 1, wherein said second node of said deep trench capacitor is constructed with a bottom oxide capacitively coupled to said semiconductor substrate.

4. The integrated circuit device according to claim 1, wherein said second node of said deep trench capacitor is ohmically connected to said semiconductor substrate.

5. A design structure embodied in a machine readable medium for designing, manufacturing, or testing an integrated circuit, the design structure comprising:
   a semiconductor substrate having a first portion in which one or more aggressor devices are formed and a second portion in which one or more victim devices are formed;
   a deep trench capacitor formed between said first portion and said second portion; and
   wherein said deep trench capacitor is electrically connected to a ground node and operative to provide noise isolation between said first portion and said second portion of said integrated circuit.

6. The design structure of claim 5, wherein the design structure comprises a netlist.

7. The design structure of claim 5, wherein the design structure resides on storage medium as a data format used for the exchange of layout data of integrated circuits.

8. The design structure of claim 5, wherein the design structure includes at least one of test data, characterization data, verification data, or design specifications.

9. The design structure of claim 5, wherein said deep trench capacitor comprises a metal contact to minimize resistance of said connection to said ground node.

10. An integrated circuit device, comprising:
    a semiconductor substrate having a first portion in which one or more aggressor devices are formed;
    a well portion formed in said semiconductor substrate; and
    said well comprising one or more victim devices and a deep trench capacitor operative to electrically couple said well portion to a ground node, thereby providing noise isolation between said one or more aggressor devices and said one or more victim devices.

11. The integrated circuit device according to claim 10, wherein said well portion comprises a single well.

12. The integrated circuit device according to claim 10, wherein said well portion comprises a double well.

13. The integrated circuit device according to claim 10, wherein said well portion comprises a triple well.

14. The integrated circuit device according to claim 10, wherein said first and second portions comprise one or more digital or analog circuits.

15. The integrated circuit device according to claim 10, wherein said deep trench capacitor comprises a metal contact to minimize resistance of the connection to said ground node.

16. The integrated circuit device according to claim 10, wherein said deep trench capacitor comprises a bottom oxide capacitively coupled to said semiconductor substrate.

17. The integrated circuit device according to claim 10, wherein said deep trench capacitor is ohmically connected to said semiconductor substrate.

* * * * *